United States Patent [19]

Dozier

[11] 4,287,851
[45] Sep. 8, 1981

[54] MOUNTING AND EXCITATION SYSTEM FOR REACTION IN THE PLASMA STATE

[76] Inventor: Alfred R. Dozier, 9332 Portsmouth Dr., Huntington Beach, Calif. 92646

[21] Appl. No.: 112,786

[22] Filed: Jan. 16, 1980

[51] Int. Cl.³ .......................................... C23C 13/08
[52] U.S. Cl. .................................... 118/723; 118/721; 118/728; 118/500; 427/39
[58] Field of Search ............... 118/721, 723, 728, 500, 118/503; 427/39–41; 269/321 WE

[56] References Cited

U.S. PATENT DOCUMENTS

| | | | |
|---|---|---|---|
| 1,965,059 | 7/1934 | Seibt | 118/730 |
| 3,578,495 | 5/1971 | Pammer et al. | 156/613 X |
| 3,637,434 | 1/1972 | Nakanuma et al. | 118/730 X |
| 3,672,948 | 6/1972 | Foehring et al. | 118/719 X |
| 3,989,004 | 11/1976 | Scholer | 118/732 |
| 3,998,333 | 12/1976 | Kamada | 432/258 X |
| 4,016,006 | 5/1977 | Yoshinaka et al. | 148/189 X |
| 4,048,953 | 9/1977 | Froberg | 118/733 X |
| 4,053,294 | 10/1977 | Sullivan | 432/258 X |
| 4,069,009 | 1/1978 | Yamawaki et al. | 432/258 X |
| 4,098,923 | 7/1978 | Alberti et al. | 118/500 X |
| 4,108,106 | 8/1978 | Dozier | 118/715 |

FOREIGN PATENT DOCUMENTS 131887 7/1978 German Democratic Rep. .. 118/715
2248764 5/1965 France ............................. 118/500

OTHER PUBLICATIONS

*IBM Technical Disclosure Bulletin,* vol. 13, No. 6, Nov. 1970, p. 1459, Eshback et al., "Emitter Diffusion System".
*IBM Technical Disclosure Bulletin,* vol. 19, No. 10, Mar. 1977, pp. 3734–3735, Clark et al. "Water Holder".

*Primary Examiner*—Ralph S. Kendall
*Attorney, Agent, or Firm*—Donald D. Mon

[57] ABSTRACT

Apparatus for supporting a plurality of wafer-like substrates so as to be treatable in a plasma environment. At least three plate-like electrically conductive electrodes are provided. They are parallel to and spaced from one another along an axis. A support adjacent to each electrode supports a wafer-like substrate against at least one of the faces of at least one electrode of a pair of adjacent electrodes. A first conductive bus is conductively connected to a first set of alternate ones of the electrodes, and a second conductive bus is also provided. An individual capacitative coupling is respective to each member of a second set of the electrodes and is connected to the second bus so that each pair of adjacent electrodes and the respective capacitative coupling are in series connection, and all of the pairs of electrodes are in parallel connection.

9 Claims, 5 Drawing Figures

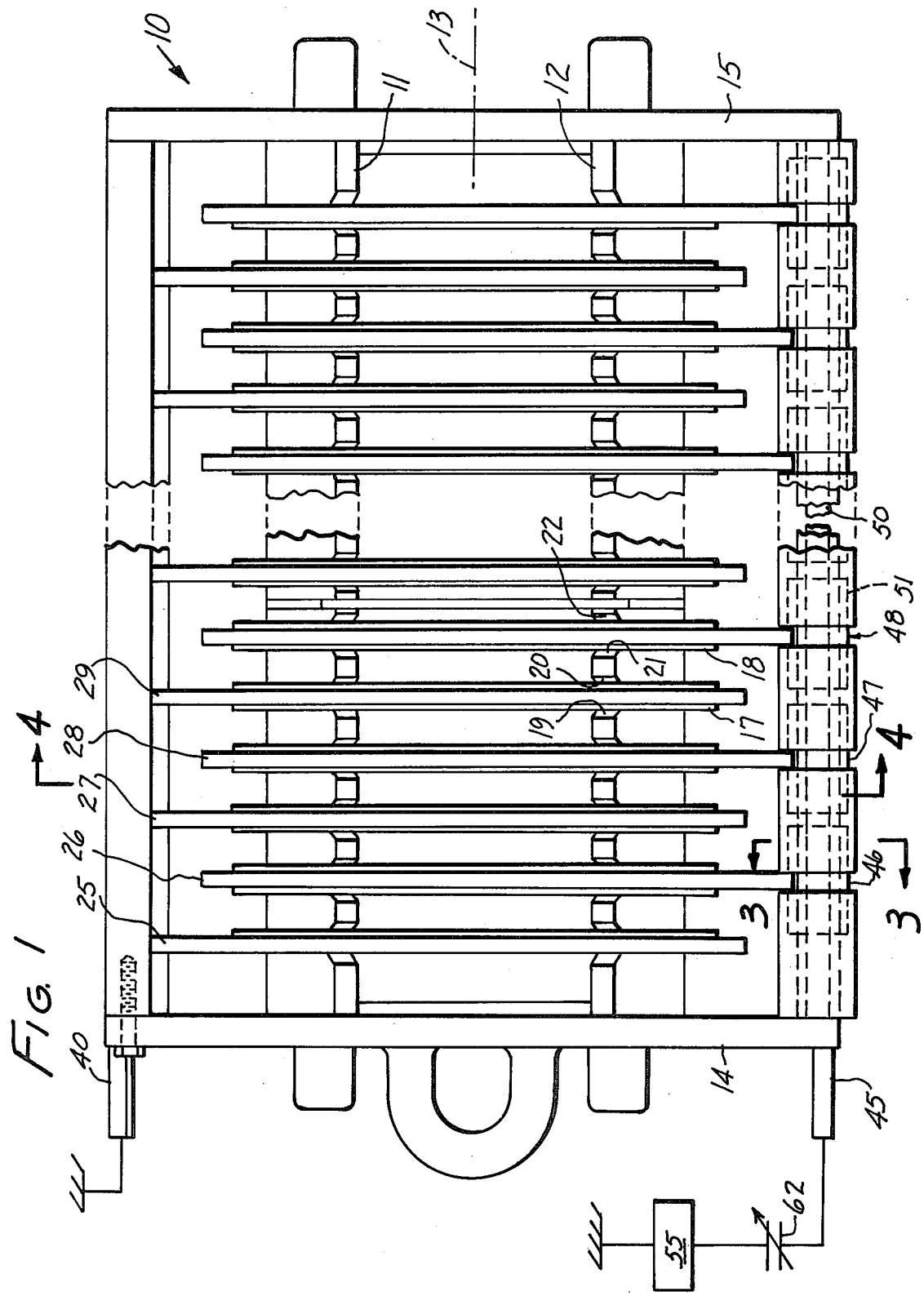

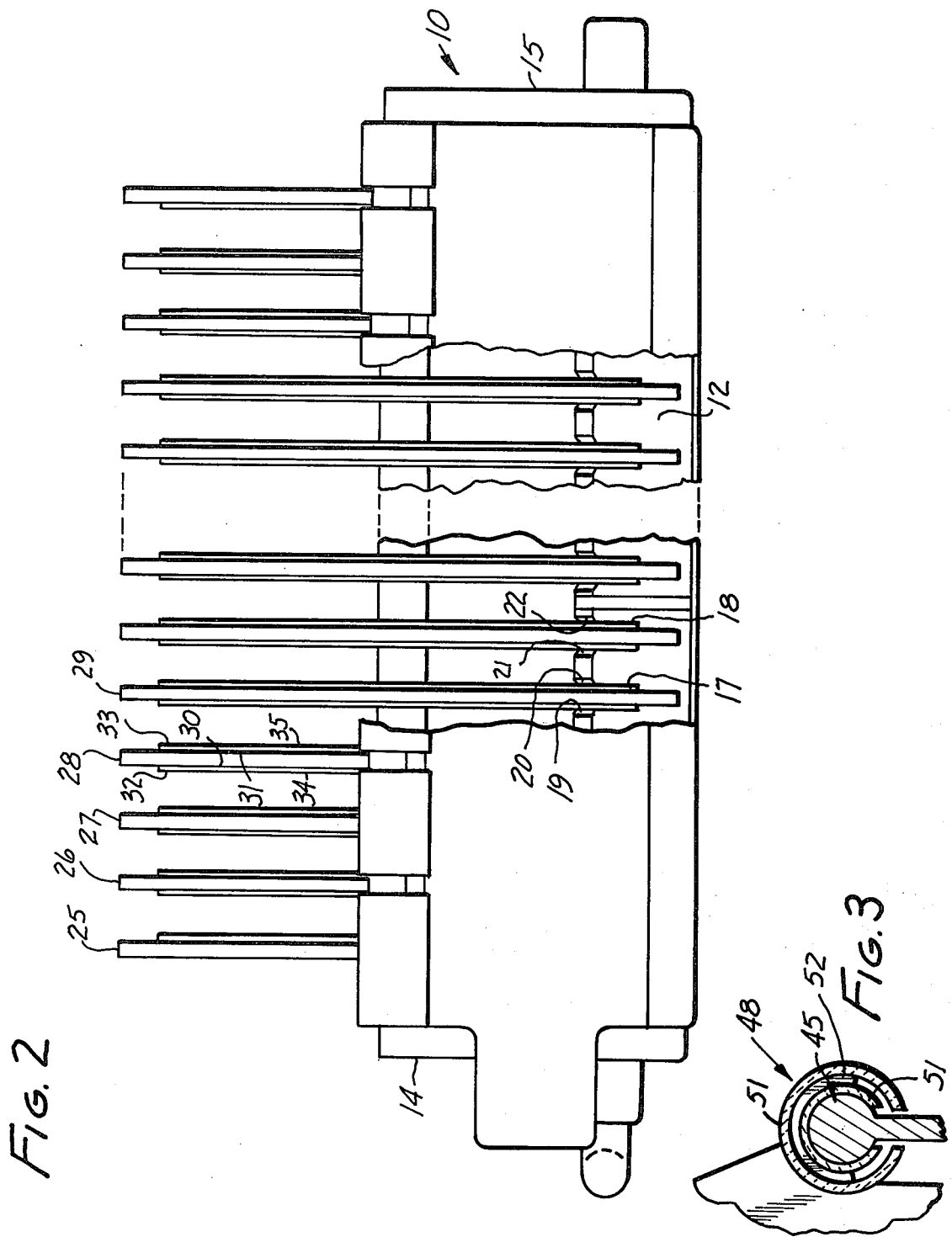

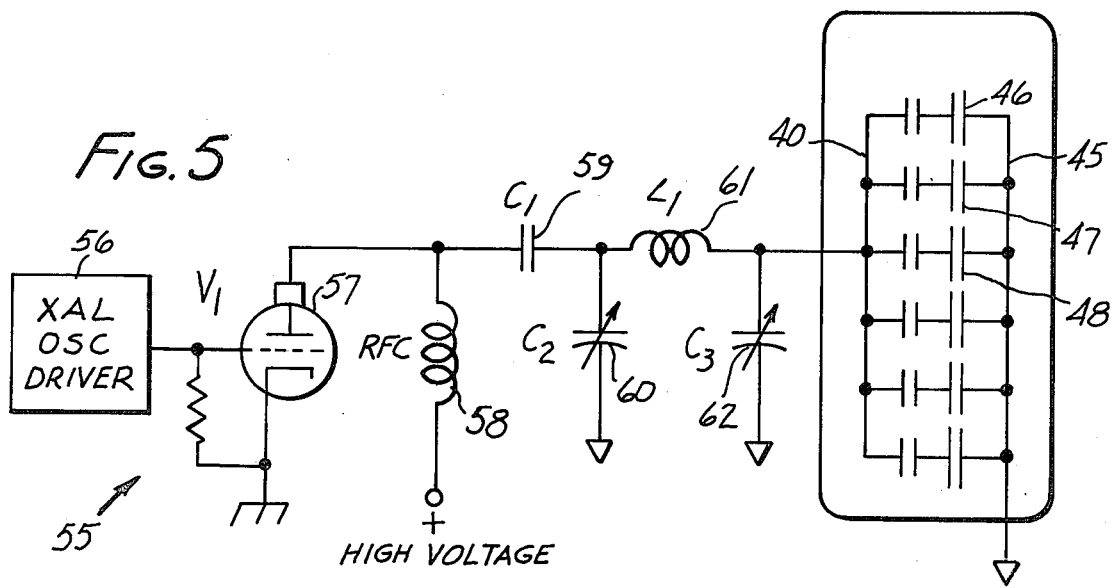
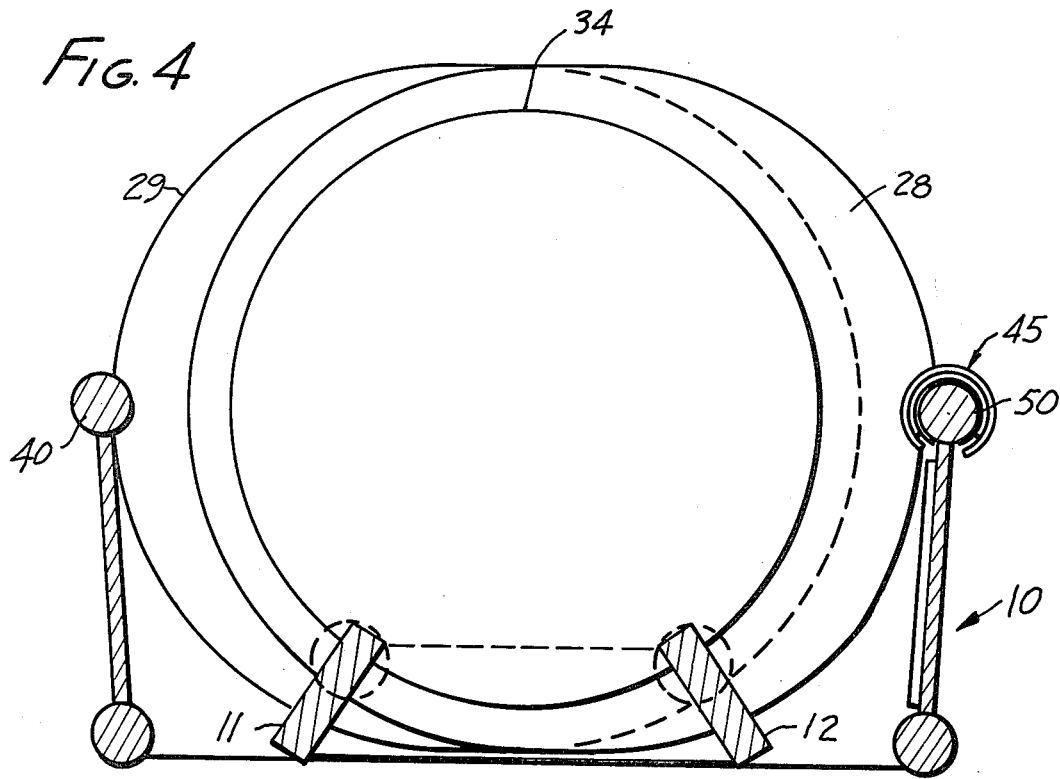

MOUNTING AND EXCITATION SYSTEM FOR REACTION IN THE PLASMA STATE

FIELD OF THE INVENTION

This invention relates to treatment of substrates in a plasma environment.

BACKGROUND OF THE INVENTION

Treatment of substrates, for example by etching, cleaning, or deposition, is conventionally carried out in reaction chambers while the reactant flows across the surface of the substrate. Atmospheric and sub-atmospheric pressures are used, as are relatively high and relatively low temperatures. In the processing of substrates, particularly silicon substrates, it is advantageous to use plasma rather than temperature as the basic drive for deposition.

It is an object of this invention to provide for such a condition, because the energy for the disassociation of the reactant can be derived from a plasma instead of from a thermal condition.

The creation of plasma conditions is relatively simple for single wafer operations. However, deposition processes are advantageously and economically conducted only in batch operations while treating a relatively large number of substrates at one time. This requires a fairly large packing factor in order to reduce the required labor and processing time. It is an object of this invention to provide for improved utilization of the reactor's volume by enabling a large number of substrates simultaneously to be treated in a plasma environment by isolating them in such a way that the reactions from one will not affect its neighbor.

BRIEF DESCRIPTION OF THE INVENTION

Apparatus according to this invention includes at least three plate-like electrically conductive electrodes parallel to and spaced from one another along an axis. Support means is provided adjacent to each of these electrodes for supporting a wafer-like substrate against at least one of the faces between each pair of adjacent electrodes. A first conductive bus is conductively connected to a first set of alternate ones of these electrodes.

According to a preferred but optional feature of this invention, at least one capacitative coupling is tunable.

The above and other features of this invention will be fully understood from the following detailed description and the accompanying drawings, in which;

BRIEF DESCRIPTION OF THE DRAWINGS

FIG. 1 is a plan view of the presently preferred embodiment of the invention;

FIG. 2 is a side view of FIG. 1;

FIG. 3 is a fragmentary cross-section taken at line 3—3 in FIG. 1;

FIG. 4 is a side view taken at line 4—4 in FIG. 1; and

FIG. 5 is a schematic diagram showing a useful circuit for use with the device of FIG. 1.

DETAILED DESCRIPTION OF THE DRAWINGS

FIG. 1 shows a substrate holder 10 adapted to fit inside of a reaction chamber of the type customarily used in chemical vapor deposition or etching processes. The details of the chamber are of no importance to the invention, and for that reason will not be shown. Customarily this chamber is at least partially evacuable so as to operate at less than atmospheric pressure, for example at pressures on the order of about 1 torr.

The substrate holder includes a pair of support means 11, 12 which extend along an axis 13. The support means are plate-like, and are supported at their ends by end plates 14, 15 to which they may conveniently be fused. End plate 14 is provided with a loop 16 which can be used for a handle.

Support means 11 and 12 are identical. Each has a plurality of notches 17, 18 which have faces 19, 20, 21, 22 which slope toward each other for purposes to be described. These notches are deep enough to receive plate-like electrodes 25, 26, 27, 28, 29, etc. These electrodes fit closely in the bottom portions of the slots and project inwardly as "walls". The sloping faces terminate at an edge. Thus, at each side of the electrodes there is a sloping face which receives the edge of a substrate and guides the substrate toward the electrode so as to bear against it. For example, faces 30 and 31 of substrates 32 and 33 bear against electrode 29. It will be observed that other substrates such as for example substrates 34 and 35 are contiguous to faces of other electrodes. This is the technique for holding the substrate in the holder.

The electrodes are formed in sets. There are two sets. The members of the sets alternate. For example, a first set of electrodes comprises electrodes 25, 27, 29, etc. A second set comprises electrodes 26, 28, etc., respectively. There may be as many sets as desired. While the theoretical minimum is one electrode for one set, and two for the other, it is obvious that the numbers will be much larger. Usually one set will have one more electrode than the other.

A first conductive bus 40 extends the length of a substrate holder. To it there is conductively attached every electrode of the first set. A second conductive bus 45 extends the length of the substrate holder. To it is connected every electrode of the second set of electrodes.

The connection of the first conductive bus to the first set of electrodes is direct. The connection between the second conductive bus and the second set of electrodes is indirect, and includes an individual capacitative coupling respective to each member of the second set. For example, there are capacitative couplings 46, 47, 48, etc. Because they are identical, only coupling 46 will be shown in detail.

As best shown in FIGS. 3 and 4, the second conductive bus comprises conductive rod 50 with a circular periphery. It is intended that this rod conduct electrical potential to each of the conductive couplings. Each electrode of the second set is integrally formed with an arcuate conductive sleeve 51 which can surround the major portion of the periphery of the conductive rod. There is disposed between the conductive rod and the arcuate sleeve an arcuate insulation member 52 to form the dielectric portion of a capacitor, thereby forming a capacitative coupling for the respective second electrode and the second conductive bus. A set of second insulating spacers 53 holds the adjacent members of the second set of electrodes apart from one another.

The holder is made of non-conductive material such as quartz. The conductive parts are metallic or graphite.

Electrical circuitry, shown schematically as 55 in FIG. 1, and in more detail in FIG. 5, is adapted to place the sets of electrodes in series connection with one another through the two buses. Adjacent members of the first and second sets of electrodes form a capacitative connection. All of the pairs of adjacent electrodes are in parallel connection with one another (see FIG. 5). As best shown in FIG. 1, the arcuate sleeves 51 do not contact one another. They are coupled to each other only through their capacitors. This isolates the events occurring in one of the pairs of electrodes from those in the other pairs. When glow occurs between one pair of electrodes, its capacitative coupling restricts current flow so as not to prevent a similar event between the other pairs of electrodes.

It is useful to be able to tune this arrangement so as to provide optimum plasma conditions. One arrangement is to vary the area of the electrodes which confront one another as a gross adjustment. For this purpose the plates can be moved toward and away from one another to vary the confronting areas. Alternatively, different sizes of electrodes could be provided, and changed from run to run. "Fine tuning" can be accomplished by adjustment of internal circuitry. Capacitor 62, for example.

Suitable tunable circuits can readily be designed by persons skilled in the art. Therefore such circuitry will be shown only schematically. Classically, circuit 55 may include a suitable crystal oscillator driver 56 that is coupled to a power tube 57. A radio frequency choke 58 is connected to the output from the power tube, and is in turn coupled to a direct current-blocking capacitor 59. A variable adjustable tuning capacitor 60 is connected to the choke (the choke being connected to a high voltage terminal). The tuning capacitor is connected to ground. A tuned inductor 61 is connected between tuning capacitor 60 and a loading capacitor 62. The loading capacitor is grounded. Second bus 45 is connected to the circuit intersection of tuned inductor 61 and loading capacitor 62. It will be understood that the circuit configuration can be adjusted by suitably adjusting capacitors 60 and 62, especially capacitor 60. The isolation capacitors previously described in connection with FIG. 1 will be recognized in FIG. 5, and the individual plates of the first and second sets will be recognized there also. The first conductive bus 45 is shown connected to ground.

The operating conditions depend upon the desired operating pressure. The lower the pressure the lower the frequency. However, there are many advantages to the use of higher pressures and higher frequencies. At any frequency and pressure it is very desirable to have a uniform plasma flow and distribution. This invention enables it. Because this holder is used in an enclosure whose conditions are appropriately adjustable, the conditions for operation are not restricting.

It will now be seen that by selecting and establishing appropriate dimensions, frequencies, and operating conditions, substrates to be treated in a plasma environment may be placed adjacent to and in conductive contact with the faces of the various electrodes, and the circuitry activated. This will cause plasma conditions to exist at the exposed surfaces of the substrates. As a consequence, reactant materials which flow along the exposed faces of the substrates will receive energy for its reactions from the plasma. It does not have to be supplied by pyrolytic phenomena, such as from radiant heaters. This is an improvement in the treatment of substrates which might otherwise be warped by elevated temperature. Such inconsistencies on the surfaces would cause variations in the resulting depositions.

The pairs of opposed electrodes are isolated from one another by the capacitative means so that the plasma effects between one pair of electrodes will not necessarily be deleterious to the conditions existing between another pair of electrodes.

There is thus provided a substrate holder useful for plasma type operations which can be used in conventional chemical vapor deposition equipment, and which is modest in cost, particularly compared to its advantages.

This invention is not to be limited by the embodiments shown in the drawings and described in the description, which is given by way of example and not of limitation, but only in accordance with the scope of the appended claims.

I claim:

1. Apparatus for supporting a plurality of wafer-like substrates so as to be treatable in a plasma environment, comprising:
   at least three plate-like electrically conductive electrodes each having a face parallel to and spaced from one another along an axis;
   support means adjacent to each of said electrodes for supporting a wafer-like substrate against at least one of said faces between each pair of adjacent electrodes;
   a first conductive bus conductively connected to a first set of alternate ones of said electrodes;
   a second conductive bus; and
   an individual capacitative coupling respective to each member of a second set of said electrodes, said second set of electrodes comprising the electrodes located between the electrodes of said first set, each said capacitative coupling being connected to its respective electrode and to said second bus but not directly to any other capacitative coupling, whereby in a circuit including said first and second buses, each pair of adjacent electrodes and the respective capacitative coupling are in series relationship, and the respective members of said pairs are in parallel connection with one another.

2. Apparatus according to claim 1 in which said electrodes are plate-like.

3. Apparatus according to claim 1 in which said first bus is a continuous rod extending parallel to said axis, each electrode of said first set being electrically connected thereto.

4. Apparatus according to claim 1 in which said second bus is a continuous rod extending parallel to said axis, said rod having an arcuate periphery, and said capacitative coupling comprising an insulating spacer overlaying said arcuate periphery, and an arcuate flange on the respective electrode overlaying said insulating spacer, said arcuate flanges being spaced apart from one another.

5. Apparatus according to claim 4 in which second insulating spacer holds adjacent members of said second set apart from one another.

6. Apparatus according to claim 5 in which said first bus is a continuous rod extending parallel to said axis, each electrode of said first set being electrically connected thereto.

7. Apparatus according to claim 6 in which said electrodes are plate-like.

8. Apparatus according to claim 7 in which a pair of axially spaced-apart non-conductive end plates mounts said support means and buses, and in which said support means also supports said electrodes.

9. Apparatus according to claim 1 further including a radio frequency power supply circuit connected across said buses, said circuit being tunable.

* * * * *